(12) United States Patent
Kim et al.

(10) Patent No.: US 7,989,147 B2
(45) Date of Patent: Aug. 2, 2011

(54) METHOD FOR FABRICATING LIQUID CRYSTAL DISPLAY DEVICE

(75) Inventors: Woong Sik Kim, Gyeonggi-Do (KR); Wang-Sun Lee, Gyeonggi-Do (KR)

(73) Assignee: LG Display Co., Ltd., Seoul (KR)

( * ) Notice: Subject to any disclaimer, the term of this patent is extended or adjusted under 35 U.S.C. 154(b) by 1038 days.

(21) Appl. No.: 11/819,938

(22) Filed: Jun. 29, 2007

(65) Prior Publication Data
US 2008/0003526 A1      Jan. 3, 2008

(30) Foreign Application Priority Data
Jun. 30, 2006   (KR) .................. 10-2006-0061475

(51) Int. Cl.
*G03F 7/20*   (2006.01)
(52) U.S. Cl. .................. 430/316; 430/319; 430/321
(58) Field of Classification Search .................. None
See application file for complete search history.

(56) References Cited

U.S. PATENT DOCUMENTS
2004/0227893 A1 * 11/2004 Nam et al. .................... 349/145

FOREIGN PATENT DOCUMENTS
JP   2001281693   10/2001
JP   2002341382   11/2002
JP   2002-350899 A * 12/2002

OTHER PUBLICATIONS
Computer-generated translation of JP 2002-350899 (Dec. 2002).*

* cited by examiner

*Primary Examiner* — John A. McPherson
(74) *Attorney, Agent, or Firm* — McKenna Long & Aldridge LLP

(57) ABSTRACT

Disclosed is a method for fabricating a liquid crystal display device comprising: providing a first substrate having a pixel portion and a pad portion; sequentially laminating a gate insulating layer, a semiconductor layer and a first conductive layer on the first substrate where a gate electrode is formed; forming a first PR pattern, which is patterned relatively thin on a channel region of a transistor to be formed, on the first conductive layer with a half-tone mask; patterning the first conductive layer with the first PR pattern; forming a second PR pattern which is aligned with an outer periphery of the first conductive layer by performing a first ashing process on the first PR pattern; patterning the semiconductor layer using the second PR pattern; forming source/drain electrodes using the second PR pattern; forming a passivation layer and a pixel electrode on the first substrate; attaching a second substrate to the first substrate; and forming a liquid crystal layer between the first substrate and the second substrate.

20 Claims, 9 Drawing Sheets

METHOD FOR FABRICATING LIQUID CRYSTAL DISPLAY DEVICE

This application claims the benefit of Korean Patent Application No. 2006-061475, filed on Jun. 30, 2006, which is hereby incorporated by reference for all purposes as if fully set forth herein.

BACKGROUND OF THE INVENTION

The present invention relates to a method for fabricating a liquid crystal display (LCD) device, and more particularly, to a method for fabricating a liquid crystal display device which can obtain uniformity of a channel by replacing a slit mask used in a photolithography process with a half tone mask, and which based on the uniformity thus obtained, can reduce active tail and wavy noise phenomena by applying a pre-ashing process when forming source/drain electrodes.

Description of the Related Art

Among display devices, in particular, in a flat panel display including a liquid crystal display device, a display device is driven by active devices such as thin film transistors in each of the display pixels.

Such a method for driving the display device is generally called "an Active Matrix driving method."

In the active matrix driving method, the active devices are disposed in each of the pixels that are arranged in a matrix shape to drive a corresponding pixel.

From this point of view, a related art liquid crystal display device will now be explained with reference to FIG. 1.

FIG. 1 is a diagram showing a pixel of a liquid crystal display device implementing an active matrix pixel driving method.

As shown in FIG. 1, the related art liquid crystal display device is a thin film transistor liquid crystal display device, which uses a thin film transistor 10 as the active pixel driving device.

Referring to FIG. 1, each of the pixels in the thin film transistor liquid crystal display device (where N×M pixels are arranged vertically and horizontally) includes a thin film transistor 10 formed at an area where a gate line 13 to which a scanning signal is applied from an external driving circuit and a data line 19c to which a picture signal is applied intersect with each other.

Here, the thin film transistor 10 includes a gate electrode 13a connected to the gate line 13, an active pattern 17a formed above the gate electrode 13a and being active when the scanning signal is applied to the gate electrode 13a, and a source electrode 19a and a drain electrode 19b formed on the active pattern 17a, respectively.

A display area of the pixel is provided with a pixel electrode 25 which is connected to the source/drain electrodes 19a and 19b and receives the pixel signal through the source/drain electrodes 19a and 19b when the active pattern 17a is activated thus to operate a liquid crystal material layer (not shown).

Detailed description of the structure of the related art liquid crystal display device will now be given with reference to FIG. 2 which is a cross-sectional view taken along line II-II in FIG. 1 and shows a cross-section of the related art liquid crystal display device.

Referring to FIG. 2, the thin film transistor is disposed on a first substrate 11 which is formed of a transparent material (e.g., glass) and forms an array substrate.

Here, the thin film transistor includes the gate electrode 13a formed on the first substrate 11, a gate insulating layer 5 laminated on the entire first substrate 11 having the gate electrode 13a, the active pattern 17a formed on the gate insulating layer 5, the source electrode 19a and the drain electrode 19b formed on the active pattern 17a, and a passivation layer 23 formed on the entire first substrate 11.

In addition, the pixel electrode 25 that is connected to the drain electrode 19b of the thin film transistor through a contact hole (not shown) formed in the passivation layer 23 is formed on the passivation layer 23.

Meanwhile, a color filter substrate facing toward the array substrate 11 includes a second substrate 31 formed of a transparent material (e.g., glass), a black matrix 33 formed on the second substrate 31 and formed on an image non-display area (e.g., the area having the thin film transistor or the area between pixels) so as to prevent the penetration of light through the image non-display area, and a color filter layer 35 formed of red, green, and blue filters so as to implement real colors.

In this case, when the color filter substrate and the array substrate are attached to each other, a liquid crystal layer 41 is filled therebetween thus to complete the liquid crystal display device.

Meanwhile, a common electrode 37 may be further provided on the color filter layer 35 for supplying an electric field to the liquid crystal layer 41 in addition to the pixel electrode 25.

Such liquid crystal display devices are generally fabricated by complicated processes, such as by photolithography using a mask.

Referring to FIGS. 3A through 3G, description of a method for fabricating a liquid crystal display device by a related art 4-mask process using a slit mask will now be given in detail.

FIGS. 3A through 3G are cross-sectional views showing sequentially the process of the fabrication method for a liquid crystal display device by applying a 4-mask process using a slit mask.

First, referring to FIG. 3A, a metal layer to be used for forming a gate electrode is formed over an entire surface of a first substrate 11, and then a photoresist film (not shown) is coated thereon. Through a photolithography process, a gate line (not shown) and a gate electrode 13a connected to the gate line are formed.

Referring to FIG. 3B, a gate insulating layer 15, a semiconductor layer 17, an ohmic contact layer (an n+ amorphous silicon thin film is generally used, not shown), and a conductive layer 19 are sequentially formed over the entire surface of the first substrate 11 having the gate electrode 13a.

Herein, the conductive layer 19 is a layer to be patterned into the source electrode and the drain electrode through following procedures.

And, a photoresist film (not shown) is coated on the conductive layer 19, and light is then irradiated onto the photoresist film (not shown) through a slit mask 20 having a light shielding portion 20a, a semi-transmissive portion 20b, and a transmissive portion 20c. Then, a photoresist film pattern 21 is formed on the conductive layer 19 after exposing and developing procedures.

Here, since the photoresist film pattern 21 is formed by using the slit mask 20, a photoresist film pattern 21a formed on an upper portion of a channel area is thinner, compared to a photoresist film pattern 21b formed on another area.

Then, referring to FIG. 3C, the photoresist film pattern 21 is utilized as an etching mask such that the conductive layer 19, the ohmic contact layer (not shown), and the semiconductor layer 17 are sequentially etched thus to form an active pattern 17a.

Next, referring to FIG. 3D, an ashing process is performed on the photoresist film pattern 21. Herein, since the photoresist film pattern portion 21a over the channel region (that is, the relatively thin area of the photoresist film pattern) is removed during the ashing process, the conductive layer 19 is exposed.

The ashing process is a process whereby the photoresist film as organic matter is oxidized for removal. Some portion 21a of the photoresist film pattern 21 is removed by oxidization, thereby reducing its overall volume. Here, the photoresist film pattern 21 at the edges of the channel area and the active pattern is also removed.

Referring to FIG. 3E, the photoresist film pattern 21 after having been ashed is utilized as an etching mask such that the conductive layer on the channel area and the ohmic contact layer are removed thus to form the source electrode 19a and the drain electrode 19b.

Next, referring to FIG. 3F, after the photoresist film pattern 21 having been ashed is removed, the passivation layer 23 is formed on the substrate having the source and drain electrodes 19a and 19b.

Referring to FIG. 3G, a contact hole (not shown) for exposing the drain electrode 19b is formed in the passivation layer 23 through a photolithography procedure.

Then, the pixel electrode 25, which is connected to the drain electrode 19b and formed of a transparent electrode material, is formed.

The related art thin film transistor formed according to the sequence of the above-mentioned procedures is fabricated by the 4-mask process, in which a first mask is used for forming the gate electrode, a second mask is used for forming the active pattern and source/drain electrodes, a third mask is used for forming the contact hole to expose the drain electrode and a fourth mask is used for forming the pixel electrode.

According to the related art method for fabricating the liquid crystal display device by using the above procedures, as shown in FIG. 3E, since the photoresist film pattern 21 having been ashed also exposes the edge of the active pattern 17a, the ohmic contact layer (not shown) and the conductive layer 19 formed on the edge of the active pattern 17a are removed. Consequently, the active pattern 17a is more protruded than the source/drain electrodes, thereby causing "an active tail defect."

Detailed description of the active tail defect will be given in reference to FIGS. 4A and 4B, which are cross-sectional views showing the fabrication sequence for forming source/drain electrodes in the related art process using a slit mask, as viewed from the data line side.

As shown in FIG. 4A, the semiconductor layer 17, the ohmic contact layer 18, the patterned source/drain electrode forming conductive material 19, and the patterned photoresist film pattern 21 are disposed on the substrate 11. Detailed explanations thereof will be given in comparison with FIG. 3C.

FIG. 4A shows a state that the source/drain electrode forming conductive material 19 shown in FIG. 3C is patterned, as viewed from the data line side. That is, it is the state that the source/drain electrode forming conductive material 19 (e.g. a metallic material including molybdenum) is patterned by applying a wet etching using the photoresist film pattern 21.

In FIG. 4A, the gate electrode and a gate insulating layer are not shown. Also, the photoresist film having a relatively thin channel area is not shown, since it has a different section from FIG. 3C.

Referring to FIG. 4A, the patterned source/drain electrode forming conductive material 19 is etched more inwardly by distance d1 than the photoresist film pattern 21, i.e., undercut.

Undesirably, this may cause the active tail defect, which will be described now, in reference to the following procedures.

In FIG. 4A, the source/drain electrode forming conductive material 19 is patterned, and then a dry etching process is performed for patterning the ohmic contact layer 18 and the semiconductor layer 17 by using the photoresist film pattern 21 as an etching mask, thereby forming the active pattern.

Here, as shown in FIG. 4A, due to the shape of the photoresist film pattern 21 applied as the etching mask, an outer periphery of the etched active pattern 17a and an outer periphery of the patterned source/drain electrode forming conductive material 19 are not aligned with each other.

That is, referring to FIG. 4B, the edge of the active pattern 17a is not completely etched leaving some portion thereof remnant, resulting in undesirably having a shape of a tail.

This is called "an active tail phenomenon," having a protrusion of almost 1.7 μm as shown in FIG. 4B. The active tail phenomenon causes a reduction in an area of the pixel electrode and generates about a 2% loss in aperture ratio as a result of the area reduction.

Further, as an amorphous silicon thin film having a very thin thickness, the ohmic contact layer 18 is fully etched so as to be aligned with the outer periphery of the patterned source/drain electrode forming conductive material 19 in the above-mentioned dry etching process.

FIG. 4B is a cross-sectional view showing the state that the passivation layer 23 and the pixel electrode 25 are formed, as viewed from the data line side.

Because the conductive layer is always present under the source/drain electrode forming conductive material, light from a backlight projected from the data line side penetrates the gate insulating layer thus to directly impinge upon the semiconductor layer.

The backlight light penetrating the gate insulating layer and impinging the semiconductor layer may activate the semiconductor layer and cause defects, such as wavy noise.

At the time of forming the source/drain electrodes, the wavy noise occurs in a displayed image when the active pattern protruding more than the source/drain electrodes diffracts the backlight light or a channel signal is distracted by the backlight light.

SUMMARY OF THE INVENTION

Therefore, in order to overcome the above-mentioned problems, it is an object of the present invention to provide a method for fabricating a liquid crystal display device which can reduce active tail and wavy noise defects without requiring an additional masking process.

To achieve these and other advantages and in accordance with the purpose of the present invention, as embodied and broadly described herein, there is provided a method for fabricating a liquid crystal display device, comprising: providing a first substrate having a pixel portion and a pad portion; sequentially laminating a gate insulating layer, a semiconductor layer, a conductive layer, and a photoresist film on the first substrate where a gate electrode is patterned; forming a photoresist film pattern by patterning the photoresist film with a half-tone mask; patterning the conductive layer and the semiconductor layer with the photoresist film pattern; partially removing the photoresist film pattern through a first ashing process; forming source/drain electrodes by patterning the conductive layer with the remnant photoresist film pattern; forming a passivation layer and a pixel electrode on the first substrate; attaching a second substrate to the first substrate; and forming a liquid crystal layer between the first substrate and the second substrate.

According to another embodiment of the present invention, there is provided a method for fabricating a liquid crystal display device, comprising: providing a first substrate having a pixel portion and a pad portion; forming a gate electrode on the first substrate using a first mask; sequentially laminating a gate insulating layer, a semiconductor layer, a first conductive layer on the first substrate where the gate electrode is formed; forming a Photo Resist (PR) pattern, which is patterned relatively thin on a channel area of a transistor, on the first conductive layer with a half-tone mask; patterning the first conductive layer and the semiconductor layer using the PR pattern; partially removing the PR pattern by performing a first ashing process on the PR pattern; forming source/drain electrodes by patterning the first conductive layer using the remnant PR pattern; forming a passivation layer on the first substrate having the source/drain electrodes; partially exposing the drain electrode by patterning the passivation layer using a second mask on the first substrate; forming a second conductive layer on the first substrate; forming a pixel electrode by patterning the second conductive layer using a third mask on the first substrate; attaching a second substrate to the first substrate; and forming a liquid crystal layer between the first substrate and the second substrate.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the present invention. In the drawings.

DETAILED DESCRIPTION OF THE INVENTION

Reference will now be made in detail to an embodiment of the present invention, example of which is illustrated in the accompanying drawings.

Description will now be given in detail of the method for fabricating a liquid crystal display device according to the present invention, examples of which are illustrated in the accompanying drawings.

Figure 5:
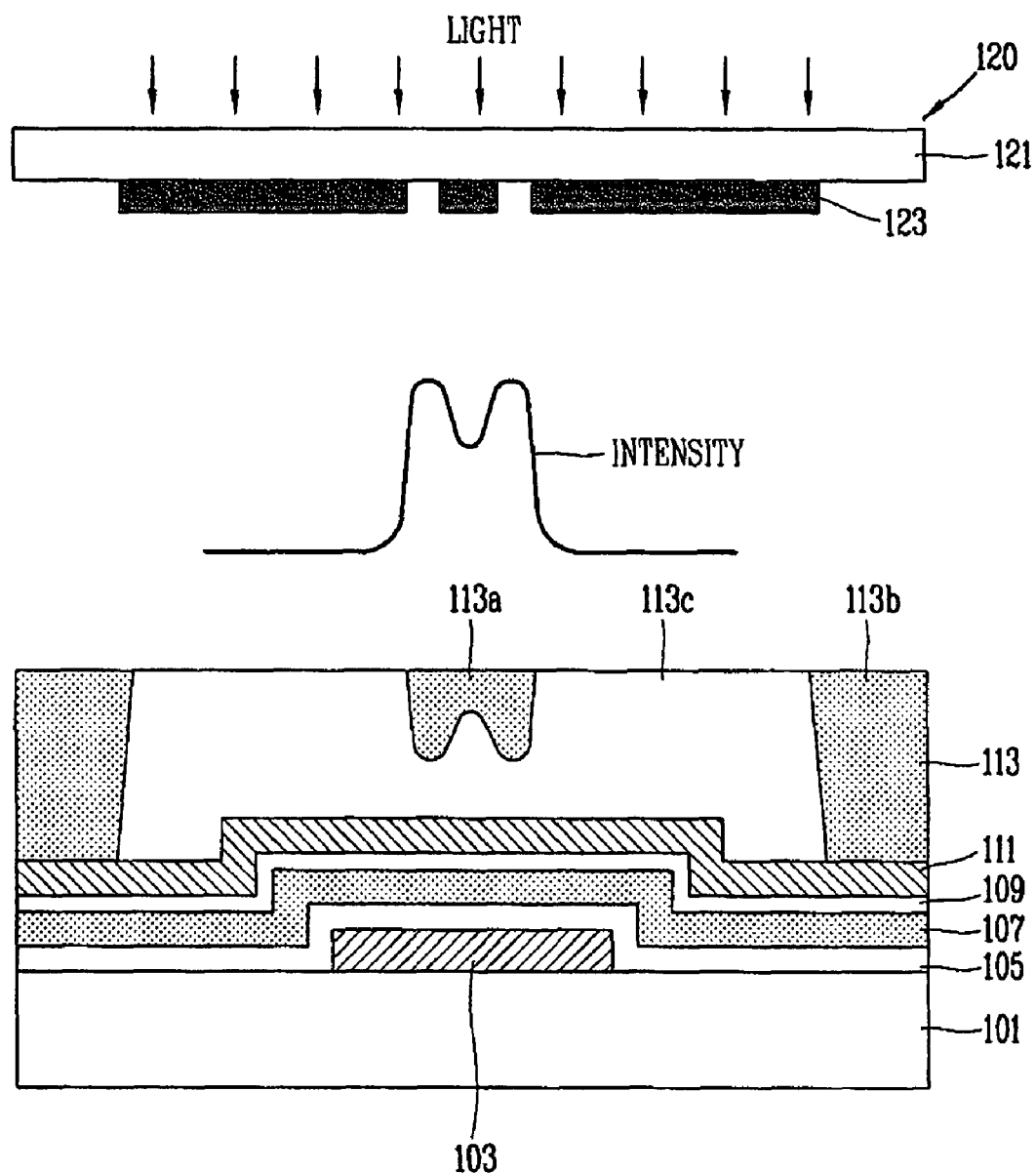
FIG. 5 is a diagram showing the non-uniformity of a channel region when a slit mask is used.

FIG. 5 is a diagram showing the intensity of light irradiated to a channel region of a thin film transistor during a photolithography process using a slit mask. In FIG. 5, reference numeral 121 denotes a transparent substrate and reference numeral 123 denotes a shielding material (e.g., chrome) formed on a shielding area in the slit mask.

Referring to FIG. 5, the slit mask 120 includes a transmissive region through which light is transmitted at 100%, a slit region through which light is transmitted at more than 0% and less than 100%, and a shielding region where light transmission is blocked.

The slit area has a slit structure, and the intensity of light irradiated through the slit structure is less than that through the transmissive region where light is fully transmitted. Accordingly, after the photoresist film 113 is coated and if the slit mask 120, which partially has the slit region and the transmissive region disposed over the photoresist film 113, is used for exposure, a thickness of the photoresist film 113a remaining under the slit region and that of the photoresist film 113B remaining under the transmissive region are formed to be different.

That is, for the case of a positive photoresist film, the thickness of the photoresist film 113a irradiated through the slit region is formed to be thicker than that under the transmissive region. However, for the case of a negative photoresist film, a thickness of the photoresist film remaining under the transmissive region is formed to be thicker than that under the slit region.

Referring to FIG. 5, when the slit mask 120 is used, the light intensity irradiated onto the channel region during the exposure process is not uniform. Accordingly, a resulting surface of the channel region thus formed is non-uniform and uneven, thereby reducing its uniformity.

Due to these problems, when the slit mask is used, it was difficult to apply a pre-ashing process before an active pattern was patterned.

Figure 6:
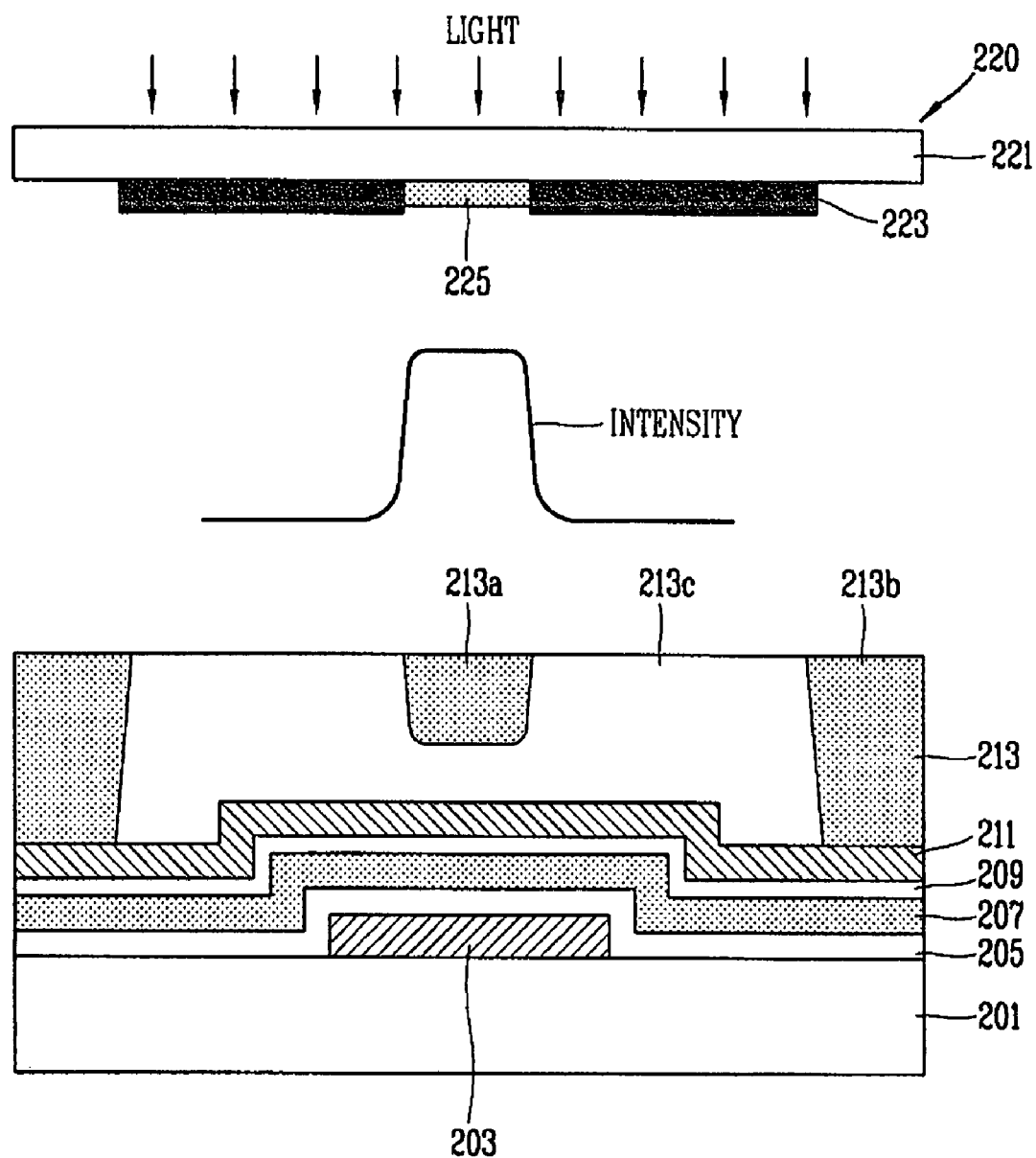
FIG. 6 is a diagram showing the uniformity of a channel region when a half-tone mask is used.

FIG. 6 is a diagram showing the intensity of light irradiated onto a channel region of a thin film transistor during a photolithography process using a half-tone mask, instead of using a slit mask, in fabricating a liquid crystal display device according to an embodiment of the present invention.

Similarly to using the slit mask, the half-tone mask 220 used in the present invention includes a transmissive region, a half-tone region (i.e., a semi-transmissive region), and a shielding region.

The half-tone region is formed of a metallic material that can control an amount of light transmitted according to its thickness (e.g., molybdenum silicide, MoSi). And, the intensity of light irradiated through the half-tone region is less than that through the transmissive region where light is fully transmitted. Accordingly, after the photoresist film 213 is coated and if the half-tone mask 220 over the photoresist film 213 is used for exposure, a thickness of the photoresist film 213a remaining under the half-tone region and that of the photoresist film 213B remaining under the transmissive region are formed to be different.

That is, for the case of a positive photoresist film, the thickness of the photoresist film irradiated through the half-tone region is formed to be thicker than that under the transmissive region. However, for the case of a negative photoresist film, a thickness of the photoresist film remaining under the transmissive region is formed to be thicker than that under the half-tone region.

In FIG. 6, reference numeral 221 denotes a transparent substrate, reference numeral 223 denotes a chrome layer for shielding light, and reference numeral 225 denotes a molybdenum silicide (MoSi) layer formed on a half-tone region. Here, if the thickness of the molybdenum silicide (MoSi) layer 225 is adjusted, the amount of transmitted light irradiated onto the photoresist film 213 may be controlled.

Referring to FIG. 6, since the intensity of light irradiated onto the channel region during the exposure process is uniform, the surface of the channel region is formed to be smooth, thereby enhancing its uniformity.

Accordingly, when the half-tone mask 220 is used, a pre-ashing process can be applied before an active pattern is patterned.

Description will now be given in detail of the method for fabricating a liquid crystal display device according to the present invention with reference to FIGS. 7A through 7C.

Figure 7A:
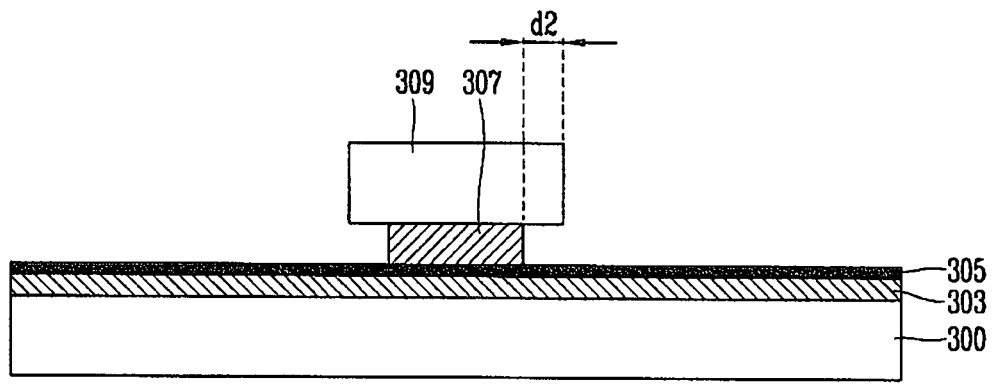
FIGS. 7A through 7C are cross-sectional views partially showing the fabrication process of a liquid crystal display device by applying a pre-ashing process using a half-tone mask, as viewed from a data line side.
Figure 7B:
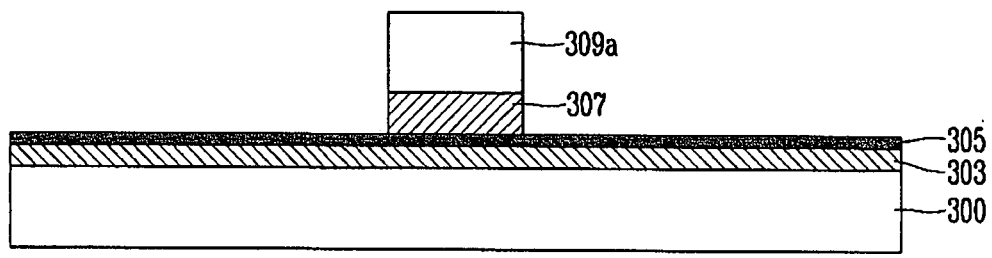
Figure 7C:
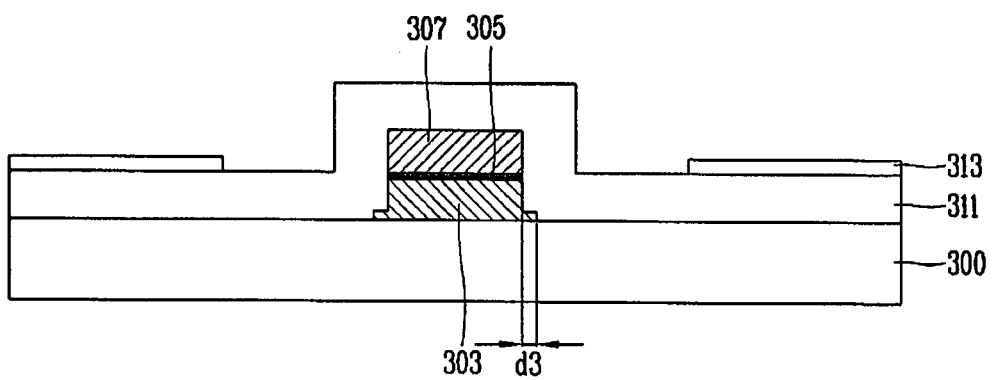

FIGS. 7A through 7C are sequential cross-sectional views showing the fabrication process utilizing a half-tone mask and applying a pre-ashing process before an active pattern is patterned, as viewed from a data line side, according to one embodiment of the present invention.

FIG. 7A shows the state that a source/drain electrode forming conductive material 307 is patterned by a wet etching process.

Referring to FIG. 7A, there is provided a substrate 300, a semiconductor layer 303 formed on the substrate 300 and to be patterned into an active pattern through following procedures, an n+ silicon thin film 305 formed on the semiconductor layer 303 for making an ohmic contact with source/drain electrodes to be formed later, a source/drain electrode forming conductive material 307 formed on the semiconductor layer having the n+ silicon thin film and having been wet-etched, and a photoresist film 309 formed above the source/drain electrode forming conductive material 307 and patterned by using a half-tone mask (not shown).

Figure 4A:
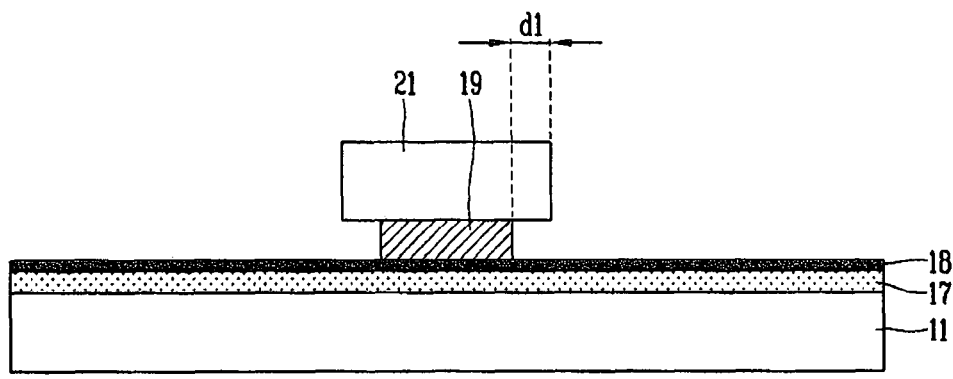
FIGS. 4A and 4B are cross-sectional views partially showing the fabrication process of a liquid crystal display device by applying a related art 4-mask process using a slit mask, as viewed from the data line side.
Figure 4B:
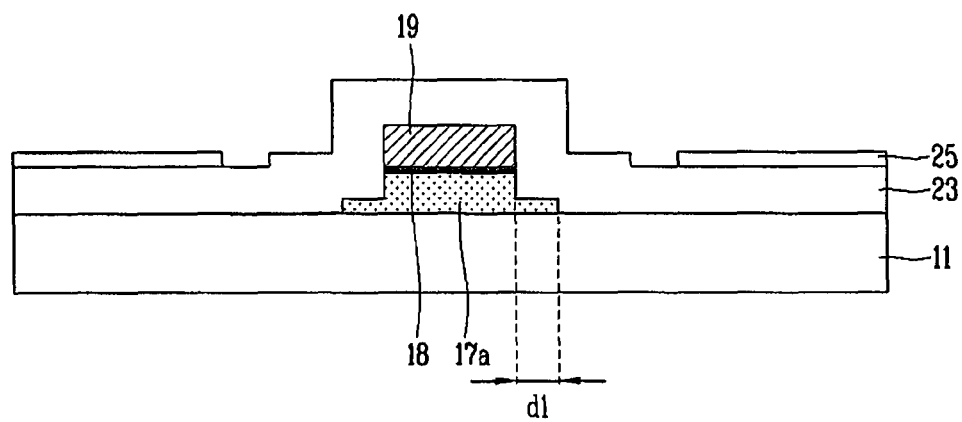

FIG. 7A does not show much difference from FIG. 4A. That is, as shown in FIG. 7A, a source/drain electrode forming conductive material 307, having been patterned more than the photoresist film 309, is more etched inwardly by distance d2.

FIG. 7B shows the state that a pre-ashing process is applied before an active pattern is formed by patterning of the semiconductor layer 303.

The photoresist film 309a remaining after the pre-ashing process has a reduced lateral width. In addition, the outer periphery of the photoresist film 309a and that of the source/drain electrode forming conductive material 307 are aligned with each other, thereby remarkably reducing the possibility of generating an active tail phenomenon in following processes.

After the pre-ashing process shown in FIG. 7B, the related art fabrication process steps for a liquid crystal display device are performed. That is, the photoresist film 309a remnant after the pre-ashing process is used as an etching mask to pattern the n+ silicon thin film 305 and the semiconductor layer 303, thereby forming the active pattern, and then proceeding to an ashing process on the channel region of the thin film transistor.

Figure 1:
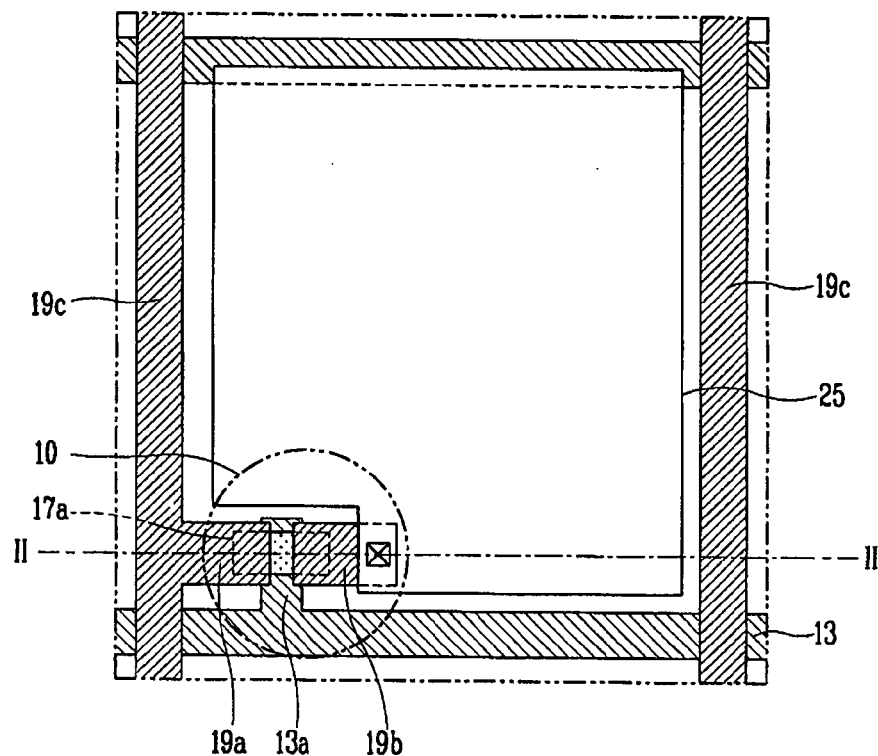
FIG. 1 is a plan view showing a unit pixel structure in a related art liquid crystal display device.
Figure 2:
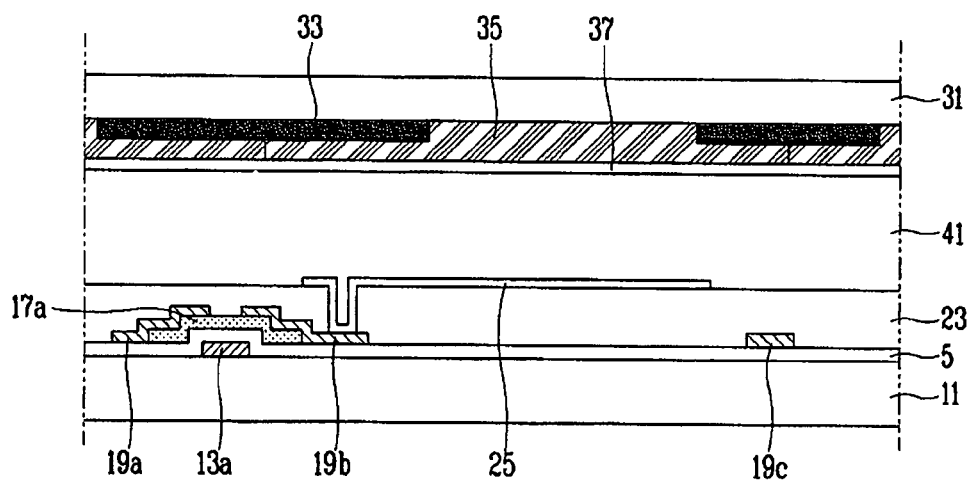
FIG. 2 is a cross-sectional view showing the related art unit pixel of FIG. 1.
Figure 3A:
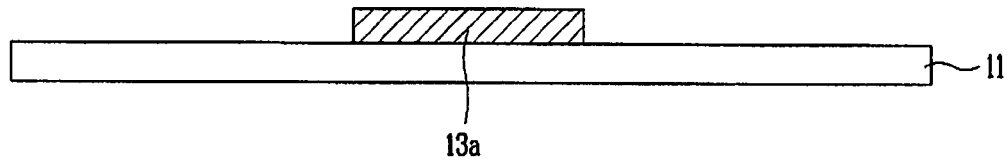
FIGS. 3A through 3G are cross-sectional views showing a method for fabricating a liquid crystal display device by applying a related art 4-mask process using a slit mask.
Figure 3B:
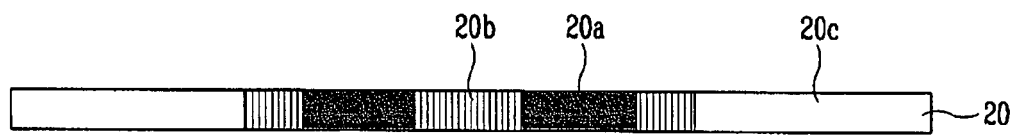
Figure 3B:
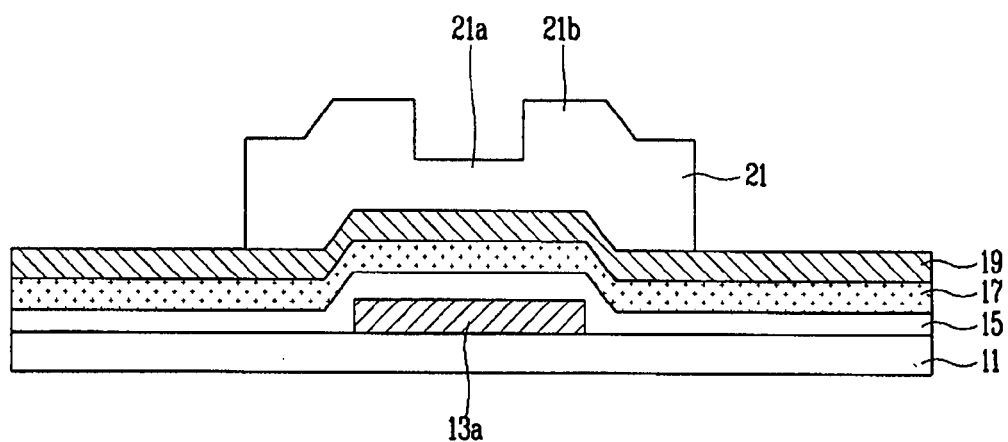
Figure 3C:
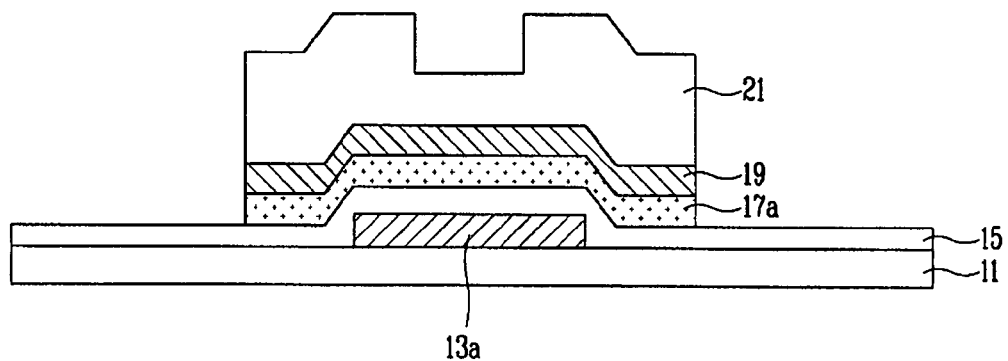
Figure 3D:
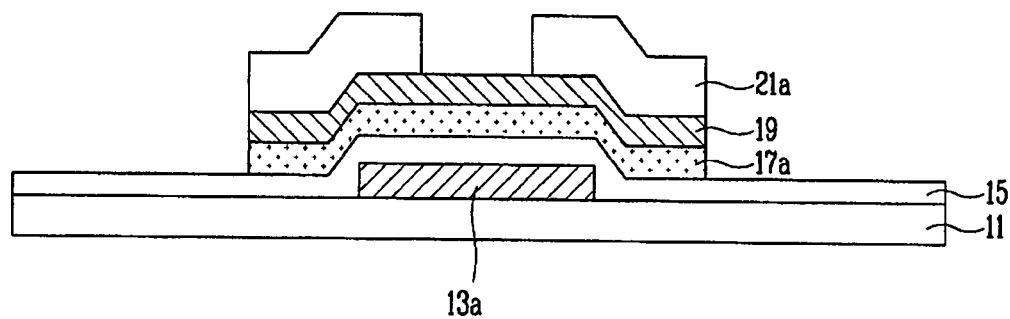
Figure 3E:
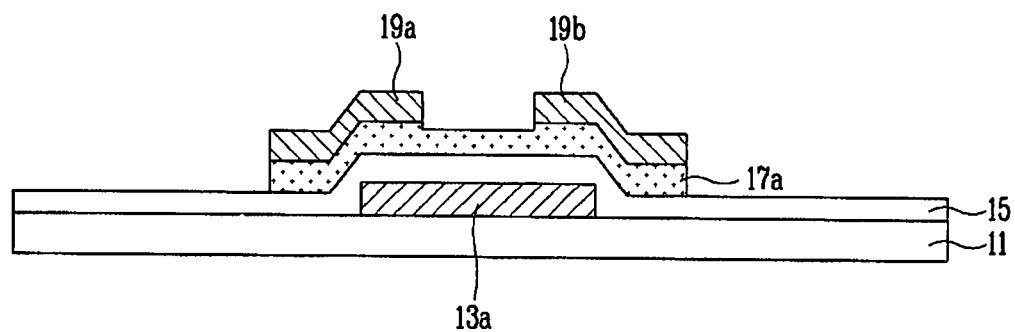
Figure 3F:
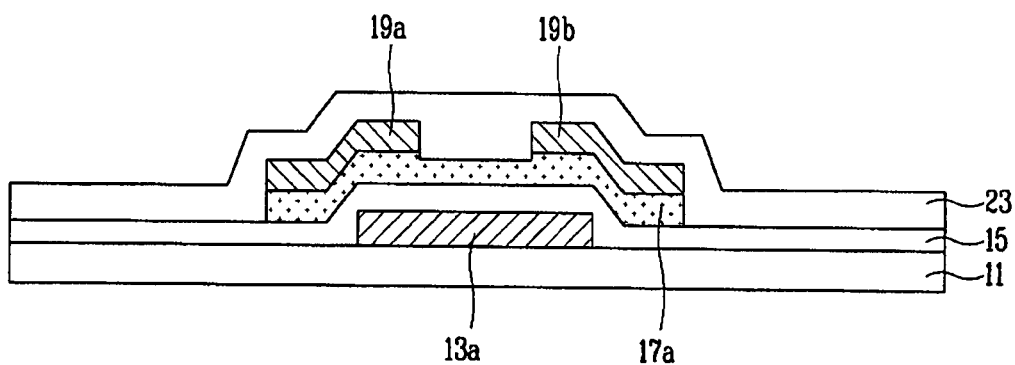
Figure 3G:
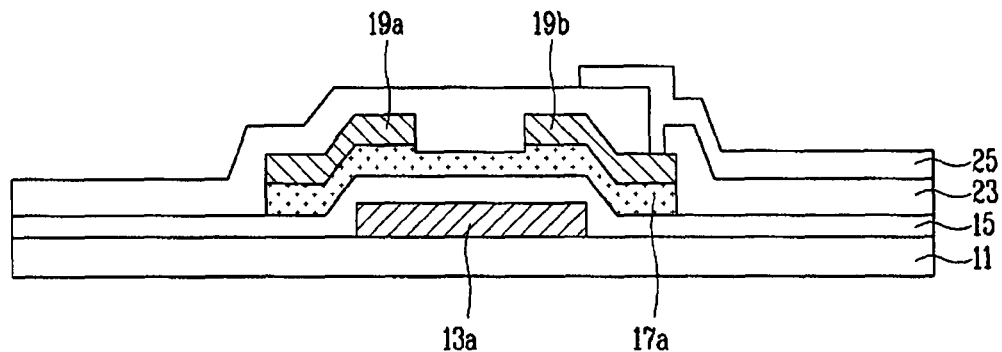

FIG. 3D shows the result of the ashing process performed on the channel region. The half-tone exposed photoresist film that is partially remaining over the channel area is completely removed, thereby exposing the source/drain electrode forming conductive material (reference numeral 19 in FIG. 3D).

Next, a dry etching process is performed to remove the source/drain electrode forming conductive material (19, reference numeral 307 in FIG. 7B) over the channel region.

Then, a dry etching process is performed to remove the n+ silicon thin film over the channel region (not shown in FIG. 3D, reference numeral 305 in FIG. 7B).

Preferably, the above-mentioned pre-ashing process and the dry etching process for removing the n+ silicon thin film over the channel region (not shown in FIG. 3D, reference numeral 305 in FIG. 7B) are integrally performed in one chamber.

Thereafter, a PR stripping process is performed for removing the remaining photoresist film, to complete the source/drain electrode formation (not shown).

Lastly, processes including a passivation layer formation, a pixel electrode formation, a liquid crystal layer formation, etc. are sequentially performed to fabricate the liquid crystal display device.

FIG. 7C is a cross-sectional view showing the state that a pixel electrode is formed, as viewed from a data line side.

In FIG. 7C, there is provided a substrate 300, a semiconductor layer 303 formed on the substrate 300, an n+ silicon thin film 305, a source/drain electrode forming conductive material 307, a passivation layer 311, and a pixel electrode 313.

Referring to FIG. 7C, an active tail in the range of only 0.3-0.5 µm is formed in the liquid crystal display device according to one embodiment of the present invention, resulting in remarkable enhancement compared to the related art active tail phenomenon occurrence.

As described above, the uniformity in the channel region of the thin film transistor may be obtained by using the half-tone mask, instead of using the related art slit-mask, according to one embodiment of the present invention. Further, based on the obtained uniformity in the channel region, the pre-ashing process may be applied before the active pattern is patterned, thereby preventing or reducing the generation of the active tail phenomenon.

Hereinafter, detailed description of a method for fabricating a liquid crystal display device according to another embodiment of the present invention will now be given with reference to FIGS. 8A through 8E, which are sequential cross-sectional diagrams showing the process of the fabrication method for a liquid crystal display device according to another exemplary embodiment of the present invention.

Figure 8A:
FIGS. 8A through 8E are cross-sectional views showing the process sequence of the fabrication method for a liquid crystal display device according to an exemplary embodiment.

In FIG. 8A, after an initial washing process is performed, a first conductive layer (not shown) to be used for a gate electrode is formed on a transparent substrate 300 (e.g., glass). Then, a patterning process (e.g., a wet etching) is performed using a first mask (not shown) to form a gate electrode 301a, a gate line 301, and a capacitor lower electrode 301b.

Here, the first mask (not shown) may be a generally used mask, not necessarily an expensive slit mask or an expensive half-tone mask.

Further, the first conductive layer (not shown) may be formed as a thin film of an opaque conductive material with a low resistance, such as aluminum (Al), aluminum alloy, tungsten (W), copper (Cu), chromium (Cr), molybdenum (Mo), etc.

The first conductive film (not shown) may be formed in a multilayer structure laminated with two or more low-resistance conductive materials.

Figure 8B:
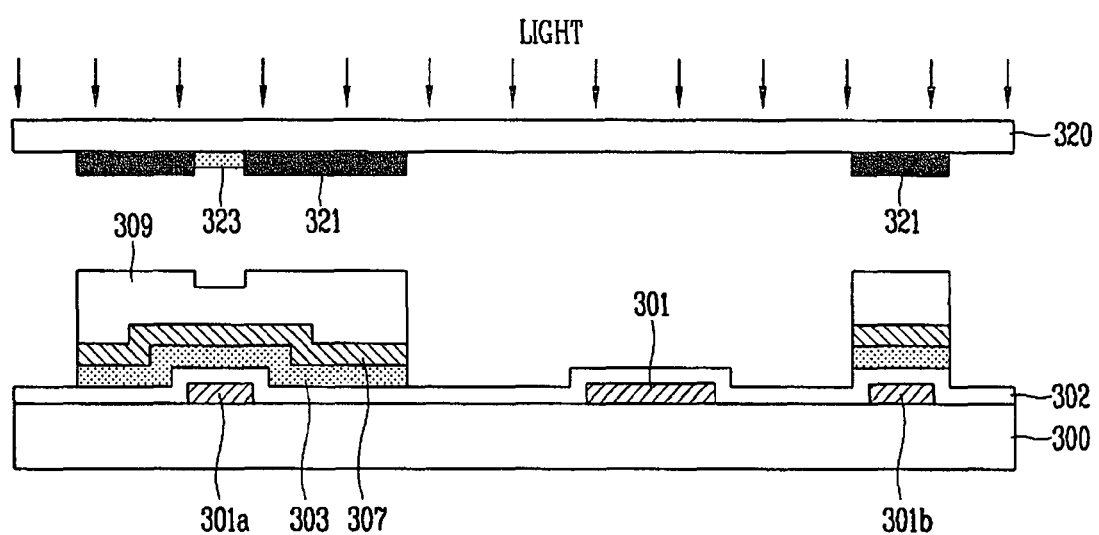
Figure 8C:
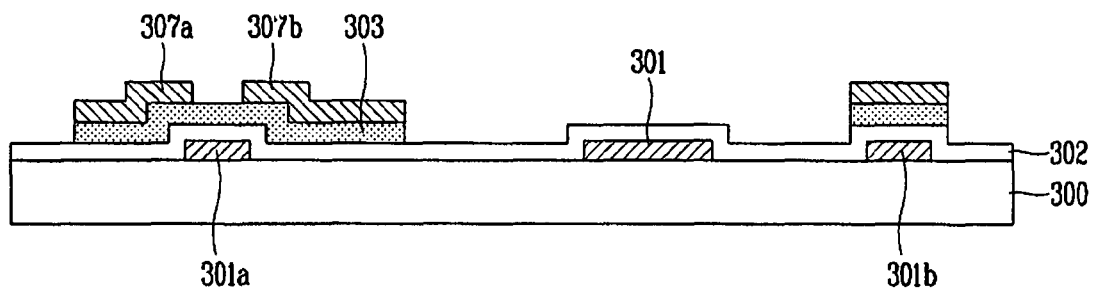

Next, FIGS. 8B and 8C shows that source/drain electrodes 307a and 307b are formed. In the process, a half-tone mask is used and a pre-ashing process is applied.

Detailed description of the process to which the pre-ashing process is applied will now be given with reference to FIGS. 8B and 8C.

Referring to FIG. 8B, a gate insulating layer 302 is formed on the substrate 300 on which the gate electrode 301 is patterned. Here, the gate insulating layer 302 may be formed of a silicon nitride (SiNx) layer, a silicon oxide layer or of other inorganic insulating materials.

A hydrogenated amorphous silicon layer 303, an n+ amorphous silicon thin film (not shown), and a second conductive layer 307 for forming source/drain electrodes are sequentially laminated on the gate insulating layer 302.

Here, the hydrogenated amorphous silicon layer 303 serves as an active area of the thin film transistor, and is a layer on which the active pattern is patterned and a transistor channel is formed through following procedures.

Further, the hydrogenated amorphous silicon layer 303 is used as a semiconductor layer for forming the active pattern, which allows to perform a low temperature process and to use an inexpensive insulating substrate.

And, the n+ amorphous silicon thin film (not shown) is an ohmic contact layer. The source electrode and drain electrode make an ohmic contact with a certain area of the active pattern through the ohmic contact layer that is formed of the n+ amorphous silicon thin film.

Herein, the second conductive layer 307 for forming source/drain electrodes may be formed of an opaque conductive material with a low resistance, such as aluminum (Al), aluminum alloy, tungsten (W), copper (Cu), chromium (Cr), molybdenum (Mo), etc.

As shown in FIG. 8C, the gate insulating layer 302, the hydrogenated amorphous silicon layer 303, n+ amorphous silicon thin film (not shown), second conductive layer 307 for forming source/drain electrodes and a photoresist film (not shown) are sequentially laminated on the substrate 300. Then, the source/drain electrodes 307a and 307b are formed by using a half-tone mask 320.

First, the photoresist film (not shown) is patterned by using a half-tone mask 320, and the second conductive layer 307 is then wet-etched by using the patterned photoresist film 309 as a mask to thus form the source/drain electrodes 307a and 307b.

In this case, the source/drain electrodes 307a and 307b may be formed in a "U-shape" so as to increase a switching speed as the channel becomes wider.

As shown in FIG. 8B, the photoresist film formed on the channel region has a thickness less than that on another area, but has a uniformity over the channel region.

After the patterning process on the second conductive layer 307 for forming source/drain electrodes, a pre-ashing process is performed according to one embodiment of the present invention.

As described above, occurrence of the active tail phenomenon can also be prevented through the pre-ashing process.

Next, as shown in FIG. 8C, the hydrogenated amorphous silicon layer 303 is dry-etched and patterned, and thereafter an ashing process is performed to remove all of photoresist film 309 left on the channel region.

Then, the second conductive layer 307 for forming source/drain electrodes which is formed on the channel region is removed by a dry etching. The n+ amorphous silicon thin film (not shown) which is formed on the channel area is removed, thereby exposing the hydrogenated amorphous silicon layer 303 on the channel area.

Further, when a PR Stripping process is performed for removing the remaining photoresist film 309, the source/drain electrodes 307a and 307b are formed.

Figure 8D:
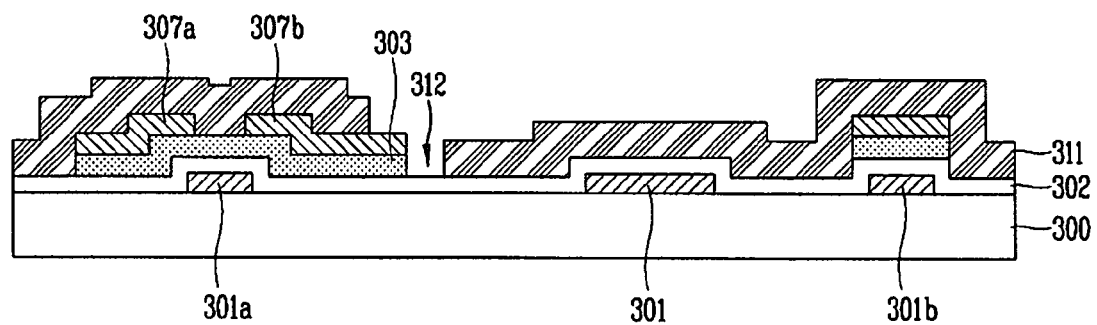

Referring to FIG. 8D, a passivation layer 311 is formed over the entire resulting structure so as to protect the device from moisture and scratches.

Then, a photolithography process is performed using a third mask (not shown) to form a contact hole (312) that exposes the source electrode 307 by penetrating a certain area of the passivation layer 311.

Figure 8E:
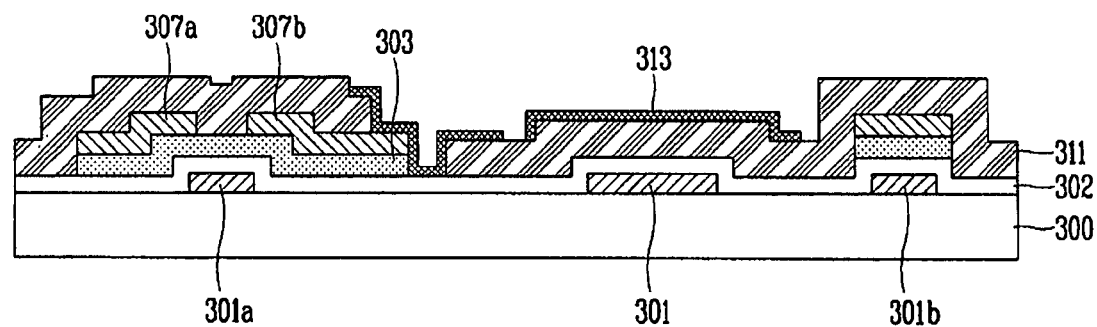

As shown in FIG. 8E, after a transparent conductive material (not shown) is deposited over an entire surface of the substrate and then is patterned through a photolithography process using a fourth mask, a pixel electrode 313 is formed to be electrically connected to the source electrode 307b through the contact hole 312.

Herein, material for forming the pixel electrode may be a transparent film of a conductive material having an excellent light transmissivity, such as Indium Tin Oxide (ITO) or Indium Zinc Oxide (IZO).

After this, general processes such as a process for filling a liquid crystal material layer in the liquid crystal display device, etc. are performed to complete the fabrication of the liquid crystal display device.

As described so far, the method for fabricating a liquid crystal display device according to the present invention can obtain uniformity of a channel region without requiring an additional masking process, can reduce occurrence of an active tail phenomenon, and improve upon wavy noise occurrence compared to the conventional art based on the uniformity obtained by additionally applying a pre-ashing process step when forming source/drain electrodes.

The foregoing embodiments and examples are merely exemplary and are not to be construed as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. A method for fabricating a liquid crystal display device comprising:
   providing a first substrate having a pixel portion and a pad portion;
   sequentially laminating a gate insulating layer, a semiconductor layer, a conductive layer and a photoresist film on the first substrate where a gate electrode is patterned;
   forming a photoresist film pattern by patterning the photoresist film using a half-tone mask;
   patterning the conductive layer and the semiconductor layer using the photoresist film pattern as a mask;

partially removing the photoresist film pattern through a pre-ashing process;

forming source/drain electrodes by patterning the conductive layer using the remnant photoresist film pattern as a mask;

forming a passivation layer and a pixel electrode on the first substrate;

attaching a second substrate to the first substrate; and forming a liquid crystal layer between the first substrate and the second substrate.

2. The method of claim 1, further comprising, in the step of sequentially laminating the gate insulating layer, the semiconductor layer, and the conductive layer on the first substrate where the gate electrode is patterned, forming an ohmic contact layer between the semiconductor layer and the conductive layer.

3. The method of claim 2, wherein the step of forming the source/drain electrodes by using the photoresist film pattern as a mask further comprises:

exposing the conductive layer on a channel region by performing an ashing process on the photoresist film pattern;

removing the first conductive layer on the channel region;

removing the ohmic contact layer on the channel region; and removing the remnant photoresist film pattern.

4. The method of claim 1, wherein the patterning of the conductive layer using the photoresist film pattern as a mask is implemented by a wet etching process.

5. The method of claim 1, wherein the step of forming source/drain electrodes using the remnant photoresist film pattern as a mask further comprises:

removing the photoresist film pattern remaining on a channel region by performing an ashing process on the photoresist film pattern; and removing the conductive layer on the channel region and the remaining photoresist film pattern.

6. The method of claim 1, wherein the conductive layer is formed of at least one of aluminum (Al), aluminum alloy, tungsten (W), copper (Cu), chromium (Cr), molybdenum (Mo), or alloys thereof.

7. The method of claim 1, wherein the pixel electrode is formed of at least one of Indium Tin Oxide (ITO), Indium Zinc Oxide (IZO) or other transparent conductive materials.

8. The method of claim 1, wherein the half-tone mask includes a transparent substrate, a light shielding layer and a semi-transmissive layer.

9. The method of claim 8, wherein chrome is used for the light shielding layer, and molybdenum silicide is used for the semi-transmissive layer.

10. The method of claim 8, wherein the light shielding layer is disposed at a position corresponding to the source/drain electrode forming regions of the conductive layer, and the semi-transmissive layer is disposed over a position on the conductive layer corresponding to the channel region.

11. A method for fabricating a liquid crystal display device comprising:

providing a first substrate having a pixel portion and a pad portion;

forming a gate electrode on the first substrate using a first mask;

sequentially laminating a gate insulating layer, a semiconductor layer and a first conductive layer on the first substrate where the gate electrode is formed;

forming a photoresist (PR) pattern on the first conductive layer using a half-tone mask; patterning the first conductive layer and the semiconductor layer using the PR pattern as a mask; partially removing the PR pattern by performing a pre-ashing process on the PR pattern;

forming source/drain electrodes by patterning the first conductive layer using the remnant PR pattern as a mask;

forming a passivation layer on the first substrate having the source/drain electrodes; partially exposing the drain electrode by patterning the passivation layer on the first substrate using a second mask;

forming a second conductive layer on the first substrate;

forming a pixel electrode by patterning the second conductive layer on the first substrate using a third mask;

attaching a second substrate to the first substrate; and forming a liquid crystal layer between the first substrate and the second substrate.

12. The method of claim 11, further comprising, in the step of sequentially laminating the gate insulating layer, the semiconductor layer and the first conductive layer on the first substrate where the gate electrode is formed, forming an ohmic contact layer between the semiconductor layer and the conductive layer.

13. The method of claim 11, wherein the patterning of the first conductive layer using the PR pattern as a mask is implemented by a wet etching process.

14. The method of claim 11, wherein the step of forming the source/drain electrodes by using the remnant PR pattern further comprises:

removing the photoresist film pattern remaining on the channel region by performing an ashing process on the PR pattern; and removing the first conductive layer on the channel region and the remaining PR pattern.

15. The method of claim 12, wherein the step of forming the source/drain electrodes using the remnant PR pattern as a mask further comprises:

exposing the conductive layer at the channel region by performing an ashing process on the PR pattern;

removing the first conductive layer at the channel region;

removing the ohmic contact layer at the channel region; and removing the remnant PR pattern.

16. The method of claim 11, wherein the first conductive layer is formed of at least one of aluminum (Al), aluminum alloy, tungsten (W), copper (Cu), chromium (Cr), molybdenum (Mo), or alloys thereof.

17. The method of claim 11, wherein the second conductive layer is formed of at least one of Indium Tin Oxide (ITO), Indium Zinc Oxide (IZO) or other transparent conductive materials.

18. The method of claim 11, wherein the half-tone mask includes a transparent substrate, a light shielding layer, and a semi-transmissive layer.

19. The method of claim 18, wherein chrome is used for the light shielding layer, and molybdenum silicide is used for the semi-transmissive layer.

20. The method of claim 18, wherein the light shielding layer is disposed at a position corresponding to the source/drain electrode forming conductive layer, and the semi-transmissive layer is disposed over the conductive layer corresponding to the channel region.

* * * * *